United States Patent
Miyai et al.

(10) Patent No.: US 7,207,105 B2
(45) Date of Patent: Apr. 24, 2007

(54) METHOD FOR PRODUCING AN INTEGRAL CERAMIC CIRCUIT BOARD

(75) Inventors: Akira Miyai, Tokyo (JP); Yukihiko Nakajima, Tokyo (JP); Hideki Hirotsuru, Tokyo (JP); Ryozo Nonogaki, Tokyo (JP); Takuya Okada, Tokyo (JP); Masahiro Ibukiyama, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 115 days.

(21) Appl. No.: 11/049,856

(22) Filed: Feb. 4, 2005

(65) Prior Publication Data

US 2005/0167792 A1    Aug. 4, 2005

Related U.S. Application Data

(62) Division of application No. 10/432,351, filed as application No. PCT/JP01/10408 on Nov. 28, 2001.

(30) Foreign Application Priority Data

Nov. 29, 2000 (JP) .............................. 2000-362450
Jun. 18, 2001 (JP) .............................. 2001-182914

(51) Int. Cl.
*H05K 3/36* (2006.01)
(52) U.S. Cl. .................. 29/830; 29/527.3; 29/831; 29/848; 174/252; 361/709
(58) Field of Classification Search .... 29/527.2–527.6, 29/830, 846, 848, 874; 174/252, 254–262; 361/706, 709; 428/209, 901
See application file for complete search history.

(56) References Cited

U.S. PATENT DOCUMENTS 5,130,498 A  *  7/1992  Yoshida et al. ............. 174/252
5,570,502 A  *  11/1996  Sawtell et al. ............ 29/527.6

FOREIGN PATENT DOCUMENTS

| JP | 11-130568 | | 5/1999 |
| JP | 11-140560 | | 5/1999 |
| JP | 11-163209 | * | 6/1999 |
| JP | 2000-277953 | | 10/2000 |

* cited by examiner

*Primary Examiner*—Minh Trinh
*Assistant Examiner*—Donghai D. Nguyen
(74) *Attorney, Agent, or Firm*—Oblon, Spivak, McClelland, Maier & Neustadt, P.C.

(57) ABSTRACT

A substrate for mounting an electronic component, includes a baseplate having a main surface formed with or without a recess. A ceramic substrate is provided on the main surface of the baseplate and has a smaller size than the baseplate. A metal layer is provided to cover both of the baseplate and the ceramic substrate. The metal layer has a surface remote from the baseplate and the ceramic substrate is made flat, the baseplate is made of a metal-ceramic composite of a metallic material and a ceramic material, and the metallic material in the composite and the metal layer have different compositions. Thus, an integral ceramic circuit board, which is resistant to repeated thermal stress and is superior in reliability can be realized.

8 Claims, 3 Drawing Sheets

METHOD FOR PRODUCING AN INTEGRAL CERAMIC CIRCUIT BOARD

The present divisional application claims the benefit under 35 U.S.C. §120 of utility application Ser. No. 10/432,351, filed May 29, 2003, the contents of which are herein incorporated by reference. This application also claims the benefit under 35 USC §119 of Japanese applications nos. 2000-362450, filed Nov. 29, 2000, and 2001-182914, filed Jun. 18, 2001.

TECHNICAL FIELD

The present invention relates to an integral ceramic circuit board, wherein a base member made of a composite of Al (aluminum) and SiC (silicon carbide), and a ceramic substrate having a high thermal conductivity are integrated with each other, and a method for producing the same.

BACKGROUND ART

In recent years, high power modules as inverters for an electric motor have been developed in the field of industrial equipment. Various improvements have been proposed for the purpose of raising reliability, based on a conventional structure wherein a ceramic circuit substrate having a chip mounted thereon and having a high thermal conductivity is soldered to a copper base.

For example, there has been proposed a structure, wherein an Al—SiC composite is used as a base material, and the Al—SiC composite is soldered to an aluminum nitride substrate with an Al-circuit (hereinbelow, referred to as the Al—SiC composite/aluminum nitride substrate with an Al-circuit).

This proposed structure can maintain practical properties even after thermal stress is repeated in 3000 cycles. This structure has significantly reliability in comparison with a conventional copper base/aluminum nitride substrate with a copper circuit. However, the proposed structure has not been widely used since this structure creates, e.g., problems in that a chip needs to have a larger size because the proposed structure has a greater thermal resistance than the conventional structure, and that the module cost is raised because the Al—SiC composite is expensive.

Under the circumstances, further investigation and development have been made for the purpose of raising reliability. In the investigation and development, there is proposed an idea wherein when producing an Al—SiC composite, the Al—SiC composite is made integrally with a ceramic substrate or a ceramic circuit substrate.

This idea has two advantages. One is that it is possible to decrease the thermal resistance since no solder is used. The other is that it is possible to eliminate a step for bonding a metallic material to a ceramic material.

However, even if being produced according to this idea, a conventional circuit substrate has a structure that it is quite difficult to be produced or there is created a problem in mass production since, e.g., a baseplate and a ceramic substrate need to be provided with complicated shapes each other when being bonded. In a case wherein the conventional circuit substrate is supposed to be quite easy to be produced, there has been created a problem that the circuit board cannot ensure high reliability since the circuit substrate is subjected to thermal hysteresis in practical use to have heat radiation properties and electric properties easily deteriorated.

The inventors have made various experiments and investigations, taking the circumstances stated earlier into account. The inventors have attained the present invention based on the finding that an integral ceramic circuit board, which is resistant to repeated thermal stress and is therefore superior in reliability, can be produced, amazingly, only by using, as a material, a layered structure wherein a specific metal layer is layered on a ceramic substrate and a porous molded product made of silicon carbide in a specific arrangement, and applying a conventional Al—SiC composite producing step to the layered structure.

DISCLOSURE OF INVENTION

The present invention provides a substrate for mounting an electronic component, comprising a baseplate having a main surface formed with or without a recess; a ceramic substrate provided on the main surface of the baseplate and having a smaller size than the baseplate; and a metal layer provided so as to cover both of the baseplate and the ceramic substrate; wherein the metal layer has a surface remote from the baseplate and the ceramic substrate made flat, the baseplate is made of a metal-ceramic composite of a metallic material and a ceramic material, and the metallic material in the composite and the metal layer have different compositions, and wherein the ceramic substrate preferably comprises a plurality of ceramic substrates.

The present invention also provides an integral ceramic circuit board comprising a circuit made of the metal layer of the substrate for mounting an electronic component; and an integral ceramic circuit board comprising a ceramic circuit substrate having a first main surface provided with a circuit, and a baseplate provided in contact with a second main surface of the ceramic circuit substrate without the circuit provided thereon, wherein a surface of the circuit and a portion of a surface of the baseplate are flush with each other, the surface of the baseplate being provided with the ceramic circuit substrate, the portion of the surface being not provided with the ceramic circuit substrate, and the baseplate and the metal layer have different compositions, and, wherein the baseplate is preferably made of a composite, which comprises a porous molded product made of silicon carbide, and a metallic material containing aluminum as a main component and impregnated thereinto; and wherein the circuit is more preferably made of a metallic material, which has a higher melting point than the metallic material containing aluminum as a main component and included in the composite forming the baseplate.

Additionally, the present invention provides a method for producing an integral ceramic circuit board comprising providing a ceramic substrate on a main surface of a porous molded product made of silicon carbide, the main surface being provided with or without a recess, providing a metal foil to cover both of the ceramic substrate and the porous molded product so as to provide a layered structure, putting the layered structure in a pressure vessel, subjecting a metallic material containing aluminum as a main component to high pressure forging to impregnate the metallic material containing aluminum as a main component into voids in the porous molded product and to make a metal layer made of the metal foil integral with the porous molded product and the ceramic substrate; and then forming a circuit from the metal layer, and preferably preliminarily providing a barrier layer on an entire surface or a portion of a surface of the metal foil.

In a mode of the present invention, the barrier layer is made of an oxide in the method. In the method, it is preferable that the barrier layer has a thickness of not less than 0.1 μm and not greater than 10 μm, or that the oxide, of which the barrier layer is made, is obtained by oxidizing an entire surface or a portion of a surface of the metal foil.

In a mode of the present invention, the metal foil is made of a metallic material containing aluminum of not less than 98.5 mass % purity as a main component in the method. In the method, it is preferable that the oxide, of which the barrier layer is made, is formed by subjecting an entire surface or a portion of a surface of the metal foil containing aluminum as a main component to anodic oxidation. It is more preferable that the method further comprises dissolving the oxide formed in the metal layer with a solution containing at least one of hydrogen halide, aluminum halide and hydrogen peroxide in a step for etching a portion of the metal layer to form the circuit.

EXPLANATION OF REFERENCE NUMERALS

1: frame
2: molten metal pouring portion (pouring gate)
3: preform housing portion
4: metal layer
5: ceramic substrate
6: metal-ceramic composite (Al—SiC composite)
7: circuit (made of high purity aluminum foil)
8: high purity aluminum foil
9: high purity aluminum foil
10: porous molded product (preform: porous molded product made of silicon carbide)
11: metal material to be impregnated (12 mass % of Si— and 0.7 mass % of Mg-containing Al-alloy)
12: circuit (12 mass % of Si— and 0.7 mass % of Mg-containing Al-alloy)

BEST MODE FOR CARRYING OUT THE INVENTION

First, a metal-ceramic composite, which serves as a baseplate, and a method for producing the composite will be explained, referring to a typical case wherein the metal-ceramic composite is an Al—SiC composite.

The method for producing the metal-ceramic composite is classified into two broad categories: an impregnation process and a powder metallurgy process. The powder metallurgy process is only at an investigation stage since this process has not provided a metal-ceramic composite acceptable in terms of properties yet. Commercially available metal-ceramic composites have been produced by an impregnation process. The impregnation process is further classified into several kinds of processes, which include a process performed at atmospheric pressure and a process performed at a high pressure (high pressure casting process). The process performed at a high pressure is further classified into a forging and casting process and a die casting process.

The method applicable to the present invention is the process performed at a high pressure, specifically a method for producing the composite by the forging and casting process and the die casting process. Both of the forging and casting process and the die casting process are processes, wherein a porous molded product (preform) having a certain strength is put into a mold having the same shape as or a similar shape to the shape of a finished product or a mold (chamber) defined by a frame and panels, and the composite is obtained by impregnating a molten metal of Al or Al-alloy (hereinbelow, referred as to the Al-molten metal) into the porous molded product at a high pressure.

It becomes possible to obtain a pre-product for a circuit board with a ceramic substrate bonded thereto at a lower price by performing bonding of the ceramic substrate and bonding or forming of a circuit metal layer when producing the composite in this manner. Although there have been several proposals with respect to this regard, under the existing circumstances, there have been no proposal that satisfies both requirements for properties and productivity as stated earlier.

With respect to a case wherein an integral structure is formed when the Al molten metal is impregnated into the preform, there have been known 1) a method wherein a ceramic substrate is provided in contact with the preform, and the ceramic circuit substrate and the preform are bonded together while the Al molten metal is being impregnated into the preform, and 2) a method wherein a ceramic substrate is provided in contact with the preform, and bonding of the ceramic substrate and the preform and forming of the metal layer are simultaneously performed while the Al molten metal is being impregnated into the preform.

The method 1) is disadvantageous in terms of cost since this method needs a step for preliminarily bonding the metal circuit to the ceramic substrate. Although the method 2) can solve this disadvantage, this method also has a problem in terms of that the metal material forming the circuit metal layer is the same as the metal material to be impregnated (hereinbelow, referred as to the impregnated metal).

As the impregnated metal, there has been generally used a metal material containing aluminum as a main component (hereinbelow, referred to as the Al alloy), such as an Al—Si alloy or an Al—Si—Mg alloy, from the viewpoint of ease in handling and the wetting property for the preform (e.g., SiC). It is general that the amount of Si is 7 to 20 mass %. When the circuit metal layer is made of that sort of metal material, two problems are raised. One is that when the ceramic substrate is made of AlN, which has a superior thermal conductivity, the ceramic substrate is cracked by repeated thermal stress in practical use as a circuit board since the Al alloy has a greater yield strength. Although this problem can be solved by using a ceramic material made of silicon nitride, which has a disadvantage of low thermal conductivity, the other problem remain unsolved. The other problem is that a soldered portion of the module with an electronic part bonded to the circuit is cracked in practical use (hereinbelow, referred to as the solder crack). The solder crack is also caused by repeated thermal stress. The reason why the solder crack is caused is that the stress caused by the thermal expansion difference between the Al alloy and the silicon chip is relieved mainly by the plastic deformation of the solder since the Al alloy has a greater yield strength as stated about the first problem. The second problem may be solved by making the circuit metal layer out of a high-purity Al material having a small yield strength. However, when the high-purity Al material is used as the impregnated metal, there is created, in some cases, a problem in that the composite fails to exhibit required properties since the high-purity Al material has a poor wetting property to SiC. Additionally, in some cases, the ceramic substrate and the metal layer are separated each other during repeated application of thermal stress since the bonding between the ceramic substrate and the metal layer is insufficient.

The inventors have devoted themselves to making investigation and have attained the present invention by finding that an integral ceramic circuit board having an Al—SiC base member can be produced relatively easily and with good precision, consequently, at a low cost by adopting the following structure.

It is general that when the Al alloy is impregnated into the preform, preliminary heating is performed for easy impregnation of a molten metal made of the Al alloy into the preform. The present invention is attained based on the fining that even when a foil made of the high-purity Al coexists with the preform, the foil is not molten during the preliminary heating, and that even when the Al alloy is contacted with the foil, the foil can maintain the same figuration as the foil had at the time of being put in a press mold. The inventors have attained the present invention based on the finding that in consideration of the facts stated earlier, it is possible to obtain an-integral ceramic circuit board with a circuit having a certain thickness and made of a high-purity Al material by providing the ceramic substrate so as to be in contact with the preform, providing a foil made of the high-purity Al material so as to be in contact with the ceramic substrate and the preform, performing preliminary heating, impregnating a molten metal of the Al alloy at a high pressure, and forming a circuit made of the foil according to conventional treatment, such as etching.

Amazingly, it is revealed that the integral ceramic circuit board thus obtained has extremely useful properties from a practical standpoint. The thermal expansion coefficient of a baseplate made of an Al—SiC composite is determined by the volume percent of the SiC component in the composite, generally about 6 to 9 ppm/K. For this reason, when the baseplate is soldered to a ceramic circuit substrate having a low thermal expansion coefficient and made of, e.g., AlN (aluminum nitride) or $Si_3N_4$ (silicon nitride), the baseplate thus combined is significantly warped so as to be convex toward the ceramic substrate. When the baseplate is fixed to, e.g., a heat radiation fin by screwing, the warp creates a gap between the baseplate and the heat radiation fin to obstruct the thermal conduction. For this reason, it has been necessary for the baseplate to preliminarily have the bonding surface with, e.g., the heat radiation fin made flat or a slight concave warp applied thereto by some kind of treatment. In the integral ceramic circuit board according to the present invention, the circuit provided on a surface of the baseplate is made of high-purity Al and consequently has a great thermal expansion coefficient. When the ceramic substrate is made of AlN having a thermal expansion coefficient of 4.5 ppm/K, the baseplate is substantially flat. When the ceramic substrate is made of $Si_3N_4$ having a thermal expansion coefficient of 3 ppm/K, the baseplate is slightly warped so as to be convex toward the circuit. However, the integral ceramic circuit board according to the present invention can exhibit extremely preferable properties in practice since the warp in the latter case is merely created in such degree that the warp can be changed into a warp being convex toward the circuit in a module assembly process.

Now, the present invention will be described in detail, referring to a typical case wherein the present invention is carried out by using the forging and casting process.

First, the method for producing the Al—SiC composite will be explained. SiC powder is molded and preliminarily fired to obtain a preform. The preform is put on a panel, which has had a mold-releasing agent coated thereon. Next, the panel with the preform thereon is put into a frame-shaped mold, which has been hollowed out so as to have an inner size corresponding to the final shape of a finished composite product. The frame-shaped mold thus produced and other frame-shaped molds produced in the same way are piled up, the frame-shaped molds thus piled are sandwiched by thick plates, and the thick plates are tightened by bolts and nuts, completing a block for impregnation. Al—SiC composites are produced in such a process that the block for impregnation is put into a press mold for impregnation after the block is preliminarily heated, a molten metal made of the Al alloy is poured into the press mold as rapidly as possible in order to prevent the temperature of the block from lowering, and the Al molten metal in the press mold is pressurized by a punch to impregnate the Al alloy into the preform put in each of the frame-shaped molds.

In this process, integral ceramic circuit boards with a ceramic substrate integrally bonded to a baseplate can be obtained in the same treatment as the treatment for producing ordinary Al—SiC composites by additionally inserting a ceramic substrate and a foil made of high-purity Al when each of the preforms is put into the frame-shaped mold.

In the process stated earlier, when each of the preforms has a main surface formed with a recess (cavity) just fit to a ceramic substrate, the ceramic substrate can be accurately positioned, which is convenient for forming a circuit. When the metal foil for a circuit has a peripheral size equal to the inner size of a frame-shaped mold, the metal foil can be preventing from shifting in a subsequent step, and the positioning of the metal foil or another adjustment can be eliminated in a subsequent step.

There is no limitation to the porous molded product made of silicon carbide (the preform) used in the present invention, and the preform may be of any type. However, it is preferable that the preform used in the present invention is selected among ones having specific properties, which will be stated below. Specifically, the particularly important properties among the properties required for the Al—SiC composite are a thermal conductivity and a thermal expansion coefficient. Although the presence of a higher content of silicon carbide (SiC) in the Al—SiC composite is preferable to both properties, it is not easy to perform the impregnation when the content is too high. It is preferable in practice that the porous molded product made of silicon carbide has a relative density of from 50 to 75 vol % and contains much coarse grains. The molded product preferably has a bending strength of not less than 3 MPa since there is no possibility that the molded product having such a bending strength is cracked during handling or impregnation.

With regard to the silicon carbide (SiC) powder as a material for producing the porous molded product made of silicon carbide, it is preferable to perform size control. This is because the presence of only coarse grains cannot exhibit a required strength and because the presence of only fine powder cannot establish a required high thermal conductivity. According to the inventors' investigation, it is preferable that coarse grains made of silicon carbide and having a size of at least #350 in an amount of 40 to 80 mass %, and fine powder of silicon carbide and having a size of at least #1000 in an amount of 60 to 20 mass % are mixed together and used.

The mixed and molded powder product is generally made into the preform (the porous molded product) through a dewaxing step and a preliminarily firing step and is subjected to the impregnation step. In order to exhibit the required strength for the porous molded product made of silicon carbide, the mixed and molded powder product is fired under a non-oxidizing atmosphere or an oxidizing atmosphere. When the firing temperature is not lower than 850° C., the preform can have a bending strength of not less than 3 MPa. Although a higher firing temperature is preferable to provide the preform with a higher strength, there is created a problem that silicon carbide (SiC) is oxidized when being fired in air. Since the thermal conductivity of an obtained composite lowers when firing is performed at a temperature beyond 1100° C. in air, it is preferable that firing is performed at a temperature of not higher than 1100° C. in air.

Since it is advantageous, as stated earlier, that the preform has the recess formed thereon for positioning the ceramic substrate, it is preferable that the preform is molded by a production method using a mold, such as injection molding, dry molding, or wet molding. Although extrusion molding is difficult to form the recess in the main surface, the extrusion molding is also applicable since the positioning becomes less of a problem by, e.g., forming the recess so as to have a groove shape or contriving how to put into the frame-shaped mold.

Each of the frame-shaped molds for housing a preform includes a pouring gate for introducing the Al-molten metal into the frame-shaped mold (chamber) and is preferably made of iron. The frame-shaped mold may be produced by laser beam machining or blanking, and the frame-shaped mold is used after having a mold-releasing agent coated thereon. It is effective that the mold-releasing agent is made of fine graphite powder. It is preferable that the panels are made of an iron or stainless plate. It is extremely effective for mold-releasing that the panels have fine graphite powder or BN coated after being subjected to antioxidation treatment. The iron or stainless plate may have a thickness selected according to the thickness standard required for finished panels. When it is necessary to suppress variations in the thickness of the finished panels to not greater than 20 μm iron or stainless plats having a thickness of not less than 3 mm are applicable. When it is acceptable to suppress the variations to less than about 50 μm, iron or stainless plates having a thickness of about 0.3 mm at the minimum are applicable. The selection of the thickness of the panels is important since the selection affects productivity.

Although the ceramic substrates applicable in the present invention are made of a general purpose ceramic material, such as AlN, $Si_3N_4$ or $Al_2O_3$, the ceramic substrates are preferably made of a ceramic material having a high thermal conductivity, especially nitride ceramics, such as AlN or $Si_3N_4$ from the viewpoint of the object of the invention.

Although the metal layers according to the present invention may be of any type as long as the metallic material in the metal layers has a different composition as the metal material to be impregnated into voids in the preforms, specifically has a higher melting point than the impregnated metal material, it is preferable that the metal layers can be dealt with so as to form a circuit and have a stress relieving property. Since the Al alloy is preferably selected as the metal material to be impregnated into voids in the preforms, it is most preferable that the metal layers are made of a high-purity Al foil. Although the high-purity Al foil can be used without a problem as long as the foil has a purity of not less than 98.5%, the foil preferably has a purity of not less than 99.5% to ensure higher reliability. Although it is general that the circuits have a thickness of from about 0.2 to about 0.5 mm, it is preferable, from the viewing of suppressing the amount of warp to a small value, that the thickness is about 0.2 to about 0.4 mm in the case of AlN, and that the thickness is about 0.3 to about 0.5 mm in the case of $Si_3N_4$.

The high-purity Al foil can be also used, serving as a positioning jig in addition to the circuit material. For example, since when the preforms are molded by, e.g., extrusion molding, the preforms are difficult to be formed with the cavity for positioning a ceramic substrate therein, there is proposed a method wherein a high-purity Al foil, which has a hole for housing the ceramic substrate punched therein, is used as the positioning jig, and the metallic foil for circuit formation is provided on the foil as the positioning jig. In this method, it is preferable that the high-purity Al foil as the positioning jig preliminarily has through apertures formed therein for easy impregnation of a molten metal of the Al alloy. The metal foil for circuit formation may be used with unnecessary portions cut therefrom as long as the metal foil satisfies the conditions that the metal foil does not shift in each of the frame-shaped molds and that the foil covers the ceramic substrate in each of the frame-shaped molds.

Respective units, each of which includes the preform, the ceramic substrate and the high-purity Al foil or high-purity Al sheet in the chamber insulated with the frame-shaped mold and the panels, are layered and tightened with bolts and nuts to provide the block for impregnation. The block is put into a preliminary heating furnace to be preliminarily heated. Although it is sufficient that the preliminary heating temperature is not lower than 570° C., it is necessary that the upper limit is not higher than the melting point of pure Al. According to the inventors' experimental investigation, the preferable temperature range is from 610 to 650° C. in a case wherein the preforms are porous molded products made of silicon carbide, the metal material to be impregnated is a metal material containing aluminum as a main component, specifically an aluminum alloy containing 12 mass % of Si and 0.7 mass % of Mg, and the pure Al sheets are used as the metallic sheets. When the preliminary heating temperature is lower than 570° C., the impregnation becomes improper in some cases. When the preliminary heating temperature is higher than 650° C., there is a possibility that the pure Al sheets are molten.

The block, which has been preliminarily heated, is put into the pressing mold for impregnation, and the molten metal made of an Al—SiC alloy is poured into the pressing mold. By punching, the molten metal is pressurized to be impregnated into the preforms and simultaneously to complete bonding of the ceramic substrates and the pure Al sheets in the chambers insulated with the frame-shaped molds and the panels. In the case of the combination of the materials stated earlier, there is created no problem when the temperature of the supplied Al alloy is from 750 to 900° C. When the temperature is lower than this range, the impregnation becomes improper in some cases. When the temperature is higher than this range, there is a possibility that the pure Al sheets are molten.

The metal material to be impregnated may be made a different material, preferably a material having a lower melting point than the metal layer provided in contact with the ceramic substrate and the porous molded product made of silicon carbide in each of the units. When the metal layer is made of a pure Al foil in each of the units, a metal material containing aluminum as a main component (Al alloy) is selected. The Al alloy is preferable from the viewpoint of impregnation into the voids in the porous molded product as well.

The reason why the Al alloy is preferably selected is that the object of the present invention can be sufficiently attained since the Al alloy is molten at a lower temperature than the melting point of pure Al, since the Al alloy provides sufficient wettability to the silicon carbide powder and the ceramic substrates to establish strong bond therewith, and since the Al alloy can be fused with the pure Al sheets on the sheets to avoid the creation of a brittle alloy.

As the Al alloy, an Al—Si alloy is an extremely typical material. Al—Si alloys containing Si of from about 7 mass % to about 25 mass % can be used without a problem. When the Al—Si alloy has a minute amount of Mg added thereto, the bond to the ceramic substrates is made firmer, which is favorable. Sufficient effect can be obtained even when the amount of Mg is not higher than 1 mass %. An example of unfavorable impurities is Fe, which needs to be suppressed to not higher than 1 mass % since the strength of the Al—SiC composites, otherwise, decreases significantly.

After completion of the impregnation, the block is cooled. The integral ceramic substrates (substrates for mounting an electronic component), each of which includes the ceramic substrate provided on the main surface of the Al—SiC composite with the metal foil for circuit formation bonded to both of them, are obtained by eliminating the Al alloy in the peripheral portion of the block, disassembling the contents of the block, and eliminating the mold-releasing agent adhering on the contents by, e.g., buffing or sandblasting. An integral ceramic circuit board, on which several kinds of electronic components, such as a semiconductor device, can be mounted, can be easily provided only by subjecting the metal foil for circuit formation to, e.g., etching to form a circuit in an integral ceramic substrate thus obtained, or subjecting to an integral ceramic substrate thus obtained to processing or plating as required.

In the process for producing the integral ceramic substrates, an integral ceramic substrate thus obtained can be produced so as to have a plurality of ceramic circuit substrates mounted on the baseplate only by preliminarily providing the ceramic substrates on the main surface of the preform. Since the integral ceramic substrate thus formed can be used to easily provide a module having a structure with a plurality of ceramic circuit substrates mounted on a baseplate, the integral ceramic substrate offers an advantage of contributing to an increase in the density of the module. In both cases, the integral ceramic circuit board according to the present invention has the circuit surface and the surface of the metal layer on the baseplate formed to be flush each other.

Although the metal layer on each of the baseplates may be partially or entirely eliminated in treatment, such as etching, it is revealed according to the inventors' investigation that elimination of regions apart from the circuit by 3 mm or more in a normal application and by 1 mm or more in a low power application merely increases the etching amount without contributing to improvement in circuit properties.

Normally, etching of a metal layer made of, e.g., aluminum is performed by printing an etching resist having a desired pattern, and dissolving unnecessary portions with an etching solution, e.g., a solution made of ferrous chloride. However, when a barrier layer made of an oxide is provided as stated earlier, the oxide part remains, being not completely etched away with a normal etching solution, in some cases. When the barrier layer made of an oxide is provided, it is preferable that the oxide on the circuit surface after impregnation is eliminated by a mechanical polishing method, such as buffing. In the present invention, it is preferable that the etching process includes a step for dissolving the oxide by a solution containing at least one of hydrogen halide, ammonium halide and hydrogen peroxide. In particular, fluorine is preferable as halogen. $NH_4F$ is the most appropriate one as ammonium halide in terms of safety. In other words, elimination of the oxide by the dissolving step stated earlier is performed after etching with, e.g., a solution made of ferrous chloride, and then the Al alloy or other materials, which have entered between the metal foil and the ceramic substrates, are etched away with a solution made of ferrous chloride again. Alternatively, a similar effect can be also obtained by simultaneously performing the series steps with a solution containing these components.

However, the inventors have repeatedly made many experiments and have found the following new problem. Specifically, in the case of performing preliminary heating, which is generally performed to easily made the molten metal of the Al alloy impregnated into the SiC preforms for impregnation of the Al alloy into the block, wherein many units with the SiC preform, the ceramic substrate and the high-purity Al foil housed in a frame-shape mold are layered, when the temperature of the block is too low, poor bond occurs. Conversely, when the temperature is too high, a crack is apt to be formed in a ceramic substrate or the solder by the thermal stress repeated in practical use since melting of the high-purity Al foil is developed from the contacting surface with the molten metal made of the Al alloy during impregnation to lower the Al purity in the circuit material after impregnation, increasing the yield strength of the circuit material. From this viewpoint, the preliminary heating of the block needs to be performed in a proper temperature range. However, the problem has been found in terms of, e.g., that it is difficult to maintain the entire block in the proper temperature range up to the commencement of impregnation of the Al alloy because of unevenness in heating or heat radiation from the outer periphery of the block, and that it is not easy to maintain the entire block in the proper temperature range in particular when the block includes many layered units in order to increase the productivity in mass production.

Considering the circumstances stated earlier, the inventors have experimentally made investigation and have attained a preferred mode of the present invention by finding that only by preliminarily providing a proper barrier layer on the metal foil as a circuit material, the integral ceramic circuit board can be provided with resistance to repeated thermal stress and superior reliability, without lowering productivity.

Thus, the present invention also provides a method for producing an integral ceramic circuit board comprising providing a ceramic substrate on a main surface of a porous molded product made of silicon carbide, the main surface being provided with or without a recess; providing a metal foil to cover both of the ceramic substrate and the porous molded product so as to provide a layered structure, putting the layered structure in a pressure vessel, casting molten metal having a lower melting point than the metal foil to impregnate the molten metal into the voids in the porous molded product and to make a metal layer made of the metal foil integral with the porous molded product and the ceramic substrate, and then forming a circuit from the metal layer, characterized in that the method further comprises preliminarily providing a barrier layer on an entire surface or a portion of a surface of the metal foil.

According to this mode of the present invention, the barrier layer is preliminarily provided on the entire surface or a portion of the metal foil surface. The barrier layer serves as restraining the metal foil from being molten from the contacting surface with the molten metal when the molten metal made of, e.g., the Al alloy is impregnated. As stated earlier, when the block for impregnation is not under extremely good temperature control in the case of not using the barrier layer, the temperature of the contacting surface between a portion of the metal foil and the molten metal lowers too much to cause poor bond. Simultaneously, the temperature of the contacting surface between another portion of the metal foil and the molten metal raises too much to make the metal foil molten at the contacting surface with the molten metal, degrading the stress relieving property of that portion. For example, when the number of the layered units in the block is increased in order to increase productivity, it is accordingly difficult to maintain the temperature of the block for impregnation uniformly. In other words, the decrease in the temperature in a central portion of the block is smaller than the outer peripheral portion of the block, and the central portion is maintained at a higher temperature. As a result, the amount of the metal foil molten at the contacting surface with the molten metal is raised, increasing the occurrence of defective products.

The preferred mode of the present invention is based on finding that the provision of the barrier layer can restrain the metal foil from being molten at the contacting surface with the molten metal. Based on this finding, the inventors have revealed that the provision of the barrier layer on the metal foil can expand the acceptable temperature range in comparison with the conventional methods and have attained the preferred mode of the present invention.

The barrier layer may be of any type as long as the barrier layer has a good wetting property to the molten metal, no components in the barrier layer are molten even when being contacted with the molten metal at a high temperature, the barrier layer has a good mechanical strength and has good adhesiveness to the metal foil as the mother material, and the barrier layer has such a sufficient barrier property to prevent the molten metal from making contact with the mother material through penetration. In particular, the barrier layer is preferably made of an oxide, such as $Al_2O_3$ or $SiO_2$ since that sort of oxide is, in general, comparatively stable even at a high temperature, has a good wetting property to the molten metal made of the Al alloy and has a good barrier property. It is preferable that the barrier layer made of that sort of oxide has a thickness of not less than 0.1 μm and not greater than 10 μm. When the thickness is less than 0.1 μm, a sufficient barrier property cannot be obtained. When the thickness is greater than 10 μm, the barrier layer is a bar to make a circuit out of the metal foil, which will be stated later. By coating, e.g., an alumina sol or a silica sol on the metal foil, the barrier layer may be provided on the entire surface or an easy-to-melt portion of the metal foil.

The barrier layer may be provided by oxidizing the surface of the metal foil in chemical coating treatment or anodic oxidation. In particular, when the metal foil is made of a metallic material containing aluminum as a main component, the anodic oxidation is preferably applicable since an oxide made of aluminum and having a high barrier property can be comparatively uniformly formed, with good precision, on the entire surface or an easy-to-melt portion of the metal foil.

Now, the present invention will be further described in detail, referring to examples and a comparative example. It should be understood that the present invention is not limited to the examples and the comparative example.

EXAMPLE 1

70 g of silicon carbide powder A (manufactured by Pacific Random Co. Ltd.: NG-220, average size: 60 μm), 30 g of silicon carbide powder B (manufactured by Yakushima Denko Co., Ltd.: GC-1000F, average size: 10 μm) and 10 g of silica sol ("SNOWTEX" manufactured by Nissan Chemical Industries, Ltd.) were weighed. They were mixed together for 30 min by an agitating blender. Then, the mixture was molded in a flat plate-shaped product, which had dimensions of 110 mm in length, 90 mm in width and 4.6 mm in thickness, and which had a central portion on a single side formed with a cavity having dimensions of 50 mm in length, 50 mm in width and 0.6 mm in depth. The shaping pressure was 10 Mpa.

The molded product was made into a porous fired product made of silicon carbide having a relative density (bulk density) of 65 vol % by being fired at a temperature of 950° C. in the atmosphere for 2 hr.

Figure 1:
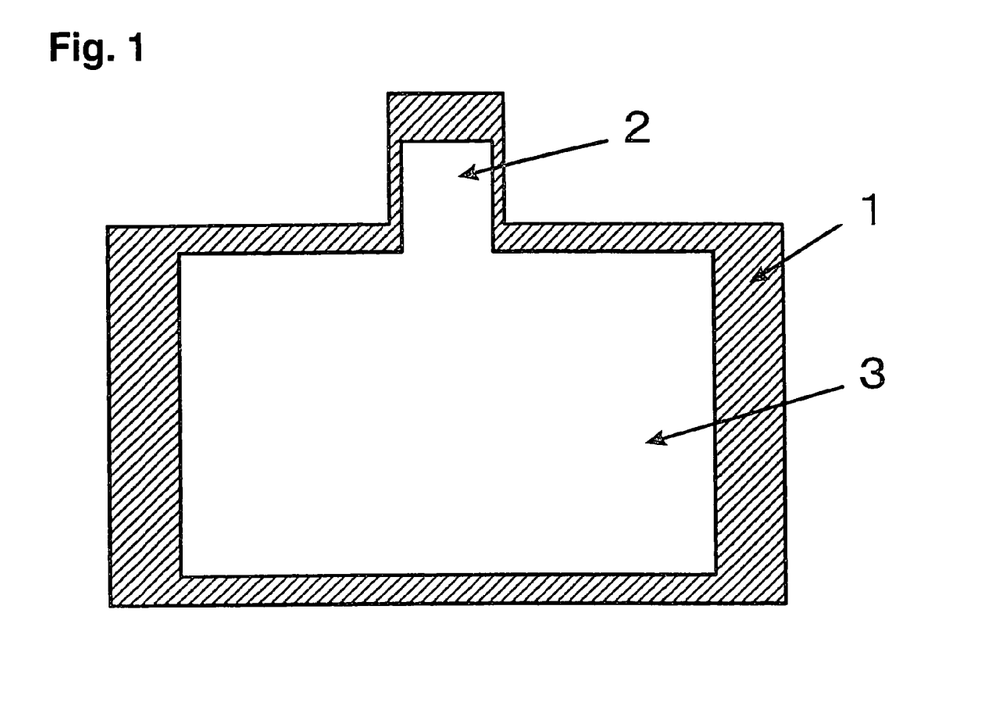
FIG. 1 is a plan view of a frame used in an impregnation process in Examples according to the present invention and Comparative Example.

Next, the porous fired product was put in a frame (material: carbon steel) as shown in FIG. 1, which was coated with a mold-releasing agent. The frame had been put on a first panel, which was also coated with a mold-releasing agent and had a thickness of 0.7 mm. A ceramic substrate, which was made of aluminum nitride, had dimensions of dimensions of 50 mm in length, 50 mm in width and 0.6 mm in thickness and a property of 170 W/mk, was inserted into the cavity of the porous fired product. Then, a pure aluminum foil, which had a size equal to the peripheral size of the porous fired product and had a thickness of 0.4 mm, was put on the surface of the porous fired product with the ceramic substrate inserted therein. The frame had a height substantially equal to the total height of the contents therein at this stage. A second panel, which was coated with a mold-releasing agent (and, which was similar to the first panel and had a size equal to the peripheral size of the frame) was put on the pure aluminum foil. Iron plates having a thickness of 6 mm were placed on the outer surfaces of both panels, and the iron plates were fixed with bolts having a diameter of 10 mm and mating nuts. Thus, a block was completed.

Figure 2:
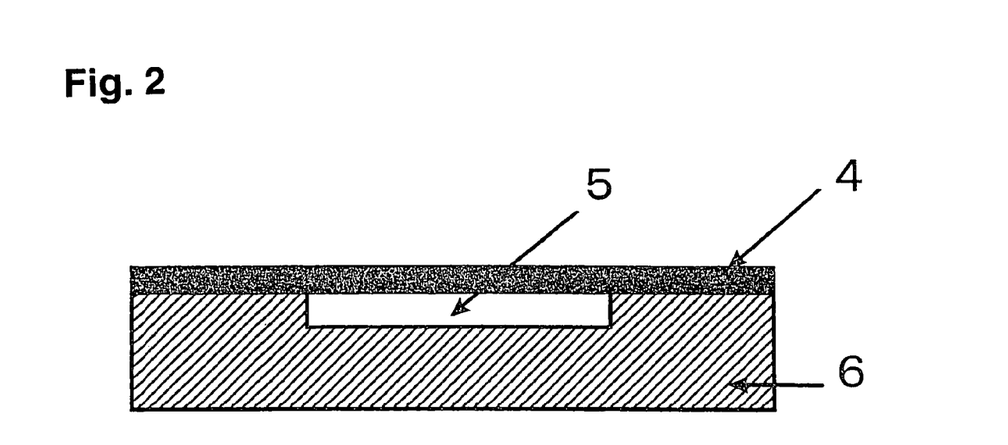
FIG. 2 is a cross-sectional view explaining the structure of the integral ceramic circuit board (substrate for mounting an electronic component) according to Example 1 of the present invention.

The block was preliminarily heated to a temperature of 650° C. in an electric furnace. The block thus preliminarily heated was put in a press mold, which had been preliminarily heated and included a hollow space having an inner diameter of 250 mm and a depth of 300 mm. A molten aluminum alloy (12 mass % of Si— and 0.7 mass % of Mg-containing aluminum alloy), which had been heated to a temperature of 850° C., was poured into the hollow space, and pressing was performed under a pressure of 100 MPa for 10 min to impregnate the aluminum alloy into the porous fired product. The metal pig containing the composite thus produced was cooled to room temperature and was cut by a wet band saw to take out the frame, and an integral ceramic substrate was in turn taken out of the frame (see FIG. 2).

Figure 3:
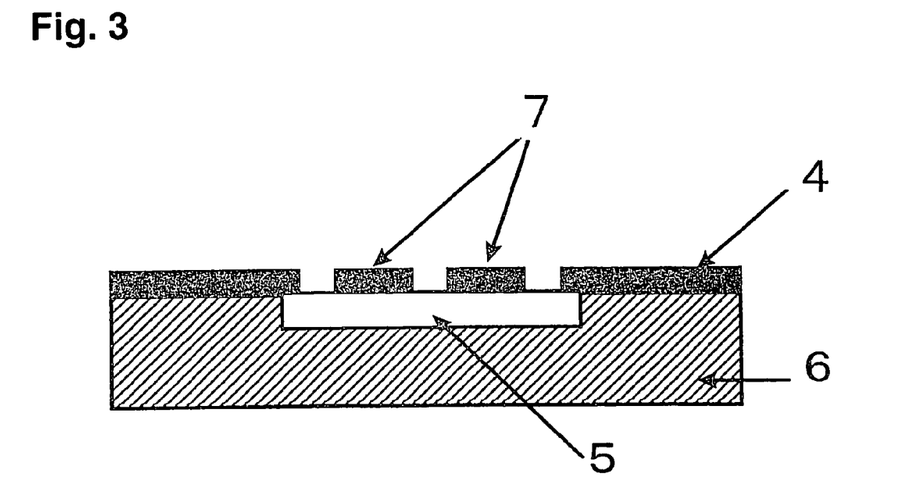
FIG. 3 is a cross-sectional view explaining the structure of the integral ceramic circuit board according to Example 1 of the present invention.

In order to remove the mold-releasing agent adhering on the surface of the integral ceramic substrate, the integral ceramic substrate was passed through a buffing machine having #220 of buffing rolls. After the mold-releasing agent was removed, the outer surface of the pure aluminum foil had an etching resist printed thereon in a desired pattern, and the rear surface and the lateral surfaces of the integral ceramic substrate had the etching resist coated all over thereon. Unnecessary portions were dissolved with a solution of ferrous chloride. An aluminum alloy pouring portion for impregnation was cut, and drilling was carried out to form a hole for mounting a heat radiation fin. Then, plating was performed to complete an integral ceramic circuit board. The plating was performed by two steps of electroless-plating of Ni and P in a thickness of 5 µm and electroless-plating of Ni and B in a thickness of 2 µm (see FIG. 3). The circuit forming surface was provided with a plated layer of Ni and P in a thickness of 5 µm and a plated layer of Ni and B in a thickness of 2 µm. At that stage, the board had a concave warp having about 30 µm on the circuit forming surface.

Next, a silicon chip having 12 mm square and a thickness of 0.4 mm was soldered to a circuit pattern applied on the integral ceramic substrate, and a thermal shock test was periodically carried out. As the conditions of thermal shock test, one cycle was determined as containing placing at −40° C. for 30 min, placing at room temperature for 10 min, placing at 125° C. for 30 min and placing at room temperature for 10 min. After the thermal shock test was carried out in 1000 cycles, it was observed in detail, e.g., whether a crack occurred at the soldered portion under the silicon chip, the substrate per se was cracked, and peeling occurred at the circuit. No trouble was found.

EXAMPLE 2

70 g of silicon carbide powder A (manufactured by Pacific Random Co. Ltd.: NG-220, average size: 60 µm), 30 g of silicon carbide powder B (manufactured by Yakushima Denko Co., Ltd.: GC-1000F, average size: 10 µm) and 10 g of silica sol ("SNOWTEX" manufactured by Nissan Chemical Industries, Ltd.) were weighed. They were mixed together for 30 min by the agitating blender. Then, the mixture was molded in a flat shape having dimensions of 110 mm in length, 90 mm in width and 4 mm in thickness under a pressure of 10 MPa.

Figure 4:
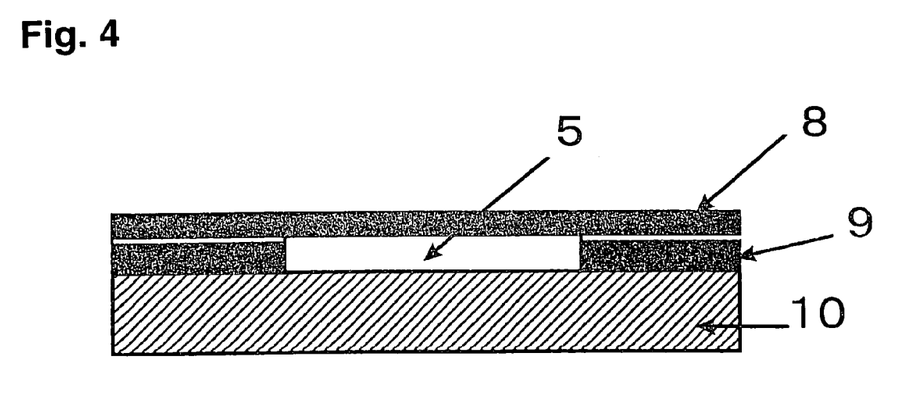
FIG. 4 is a view explaining the arrangement of respective elements just before impregnation in Example 2 of the present invention.

The molded product was made into a porous fired product made of silicon carbide having a relative density of 65 vol % by being fired at a temperature of 950° C. in the atmosphere for 2 hr. Next, the porous fired product was put a frame (material: carbon steel) as shown in FIG. 1, which was coated with a mold-releasing agent. The frame had been put on a first panel, which was also coated with a mold-releasing agent and had a thickness of 0.7 mm. A first pure aluminum foil, which had a window having 50 mm×50 mm formed in a central portion thereof, had a size substantially equal to the peripheral size of the porous fired product and had a thickness of 0.6 mm, was put on a surface of the porous fired product. Then, a ceramic substrate, which was made of aluminum nitride, had dimensions of dimensions of 50 mm in length, 50 mm in width and 0.6 mm in thickness and a property of 170 W/mk, was inserted into the window of the pure aluminum foil. After that, a second pure aluminum foil, which had a size substantially equal to the peripheral size of the porous fired product and had a thickness of 0.4 mm, was put on the first foil and the ceramic substrate. The frame had a height substantially equal to the total height of the contents therein at this stage (see FIG. 4). A second panel, which was coated with a mold-releasing agent (and, which was similar to the first panel and had a size equal to the peripheral size of the frame) was put on the second foil. Iron plates having a thickness of 6 mm were placed on the outer surfaces of both panels, and the iron plates were fixed with bolts having a diameter of 10 mm and mating nuts. Thus, a block was completed.

Figure 5:
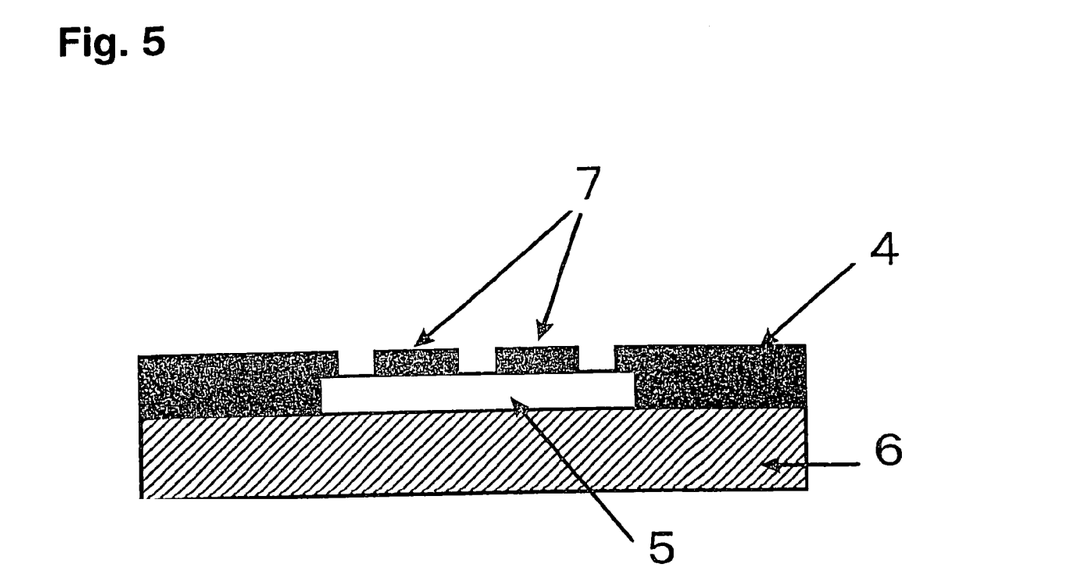
FIG. 5 is a cross-sectional view explaining the structure of the integral ceramic circuit board according to Example 2 of the present invention.

By performing the subsequent steps in the same way as Example 1, an integral ceramic circuit board was finished (see FIG. 5). The circuit forming surface was provided with a plated layer of Ni and P in a thickness of 5 µm and a plated layer of Ni and B in a thickness of 2 µm. At that stage, the board had a concave warp having about 0 mm on the circuit forming surface.

A silicon chip having 12 mm square and a thickness of 0.4 mm was soldered to the circuit pattern applied on the integral ceramic substrate, and the thermal shock test was carried out as in Example 1. After the thermal shock test was carried out in 1000 cycles, it was observed in detail, e.g., whether a crack occurred at the soldered portion under the silicon chip, the substrate per se was cracked, and peeling occurred at the circuit. No trouble was found.

COMPARATIVE EXAMPLE 70 g of silicon carbide powder A (manufactured by Pacific Random Co. Ltd.: NG-220, average size: 60 µm), 30 g of silicon carbide powder B (manufactured by Yakushima Denko Co., Ltd.: GC-1000F, average size: 10 µm) and 10 g of silica sol ("SNOWTEX" manufactured by Nissan Chemical Industries, Ltd.) were weighed. They were mixed together for 30 min by the agitating blender. Then, the mixture was molded in a flat plate-shaped product, which had dimensions of 110 mm in length, 90 mm in width and 4 mm in thickness, and which had a central portion on a single side formed with a cavity having dimensions of 50 mm in length, 50 mm in width and 0.6 mm in depth.

The molded product was made into a porous fired product made of silicon carbide by being fired at a temperature of 950° C. in the atmosphere for 2 hr. The porous fired product had a relative density of 65 vol %.

Next, the porous fired product was put in a frame (material: carbon steel) as shown in FIG. 1, which was coated with a mold-releasing agent. The frame had been put on a first panel, which was also coated with a mold-releasing agent and had a thickness of 0.7 mm. A substrate, which was made of aluminum nitride, had dimensions of dimensions of 50 mm in length, 50 mm in width and 0.6 mm in thickness and a property of 170 W/mk, was inserted into the cavity of the porous fired product. At this stage, the frame had a greater height than the contents therein by about 0.4 mm. A second panel, which was coated with a mold-releasing agent (and, which was similar to the first panel and had a size equal to the peripheral size of the frame) was put on the frame with the contents therein. Iron plates having a thickness of 6 mm were placed on the outer surfaces of both panels, and the iron plates were fixed with bolts having a diameter of 10 mm and mating nuts. Thus, a block was completed. In order to prevent the ceramic substrate of aluminum nitride from falling out of the cavity, the fixing of the iron plates was carried out, care being taken to locate the ceramic substrate of aluminum nitride at an upper position all the time.

The block was preliminarily heated to a temperature of 650° C. in the electric furnace, care being taken to prevent the ceramic substrate from falling out of the cavity. The block thus preliminarily heated was put in the press mold, which had been preliminarily heated and included a cavity having an inner diameter of 250 mm and a depth of 300 mm. A molten aluminum alloy, which was the same composition as Example 1, and which had been heated to a temperature of 850° C., was poured into the cavity, and pressing was performed under a pressure of 100 MPa for 10 min to impregnate the aluminum alloy into the porous fired product. The metal pig containing the composite thus produced was cooled to room temperature and was cut by the wet band saw to take out the frame, and an integral ceramic substrate was in turn taken out of the frame.

Figure 6:
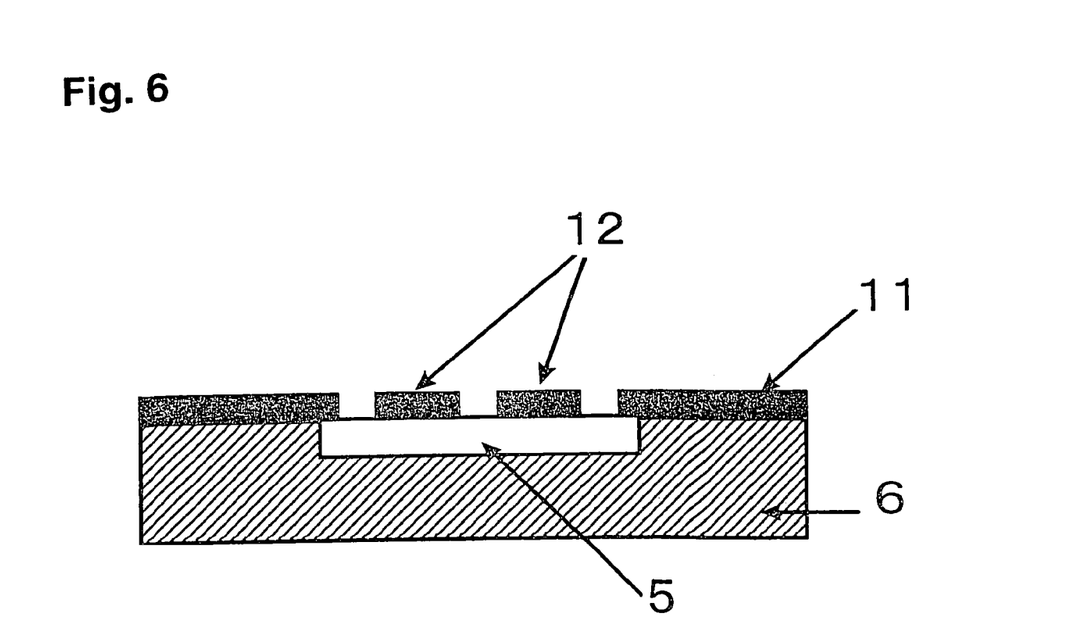
FIG. 6 is a cross-sectional view explaining the structure of the integral ceramic circuit board according to Comparative Example.

By performing the subsequent steps in the same way as Example 1, an integral ceramic circuit board was finished (see FIG. 6). The metallic surface was formed with a plated layer of Ni and P in a thickness of 5 μm and a plated layer of Ni and B in a thickness of 2 μm. The board had a concave warp having about 0 mm on the alloy surface.

A silicon chip having 12 mm square and a thickness of 0.4 mm was soldered to the circuit pattern applied on the integral ceramic substrate, and the thermal shock test was carried out as in Example 1. After the thermal shock test was carried out in 500 cycles, it was observed that a crack occurred so as to pass through the ceramic substrate.

As explained, the present invention can provide an integral ceramic circuit board by providing a ceramic substrate in contact with a porous fired product made of silicon carbide (hereinbelow, referred to as the SiC preform), providing a high purity aluminum foil in contact with the SiC preform, impregnating a molten metal or Al or the Al alloy (hereinbelow, referred as to the Al molten metal) into the SiC preform and forming a circuit out of the high purity aluminum foil on the impregnated SiC preform in the course wherein the SiC preform is put in a pressing mold, the Al molten metal is impregnated into the SiC preform under a high pressure to produce a composite of aluminum and silicon carbide.

EXAMPLE 3

By performing the same steps as Example 1, porous fired products made of silicon carbide were obtained, having a relative density (bulk density) of 65 vol %.

Next, a block was completed by the same steps as Example 1 except that pure aluminum foil had had an oxide film provided in a thickness of 1 μm on the entire surface of each of the fired products by anodic oxidation. It is noted that the block included 30 integral ceramic substrates in layers.

In order to remove the mold-releasing agent adhering on the surfaces of the integral ceramic substrates, each of the integral ceramic substrate was passed through the buffing machine having #220 of buffing rolls. After the mold-releasing agent was removed from the integral ceramic substrates, the outer surface of the pure aluminum foil on each of the integral ceramic substrates had an etching resist printed thereon in a desired pattern, and the rear surface and the lateral surfaces of the integral ceramic substrates had the etching resist coated all over thereon. Parts of the pure aluminum metal in unnecessary portions were dissolved with a solution of ferrous chloride. Then, oxides that had not been etched away were removed with a solution of $NH_4F$ and $H_2O_2$ ($H_2O_2$: 8 mass %, $NH_4F$: 10 mass %). Parts of the aluminum metal that had still remained in the unnecessary portions were dissolved with a solution of ferrous chloride. An aluminum alloy pouring portion for impregnation was cut, and drilling was carried out to form a hole for mounting a heat radiation fin in each of the integral ceramic substrates. Then, plating was performed to complete integral ceramic circuit boards. Each of the integral ceramic circuit boards was provided with two layers of a plated layer of Ni and P in a thickness of 5 μm and a plated layer of Ni and B in a thickness of 2 μm.

With regard to the 30 integral ceramic circuit boards thus produced, the molten state of each of the circuits was inspected, and each of the circuits after the thermal shock test was observed. The inspection and observation results are shown in Table 1.

TABLE 1

| | Example 3 | | Example 4 | | Example 5 | |
|---|---|---|---|---|---|---|
| Layer order No. | Molten state of circuit | Thermal shock test | Molten state of circuit | Thermal shock test | Molten state of circuit | Thermal shock test |
| 1 | ○ | A | ○ | A | ○ | A |
| 2 | ○ | A | ○ | A | ○ | A |
| 3 | ○ | A | ○ | A | ○ | A |
| 4 | ○ | A | ○ | A | ○ | A |
| 5 | ○ | A | ○ | A | ○ | A |
| 6 | ○ | A | ○ | A | ○ | A |
| 7 | ○ | A | ○ | A | ○ | A |
| 8 | ○ | A | ○ | A | ○ | A |
| 9 | ○ | A | ○ | A | ○ | A |
| 10 | ○ | A | ○ | A | ○ | A |
| 11 | ○ | A | ○ | A | ○ | A |
| 12 | ○ | A | ○ | A | Δ | B |
| 13 | ○ | A | ○ | A | Δ | B |
| 14 | ○ | A | ○ | A | Δ | B |
| 15 | ○ | A | ○ | A | Δ | B |
| 16 | ○ | A | ○ | A | Δ | B |
| 17 | ○ | A | ○ | A | Δ | B |
| 18 | ○ | A | ○ | A | Δ | B |
| 19 | ○ | A | ○ | A | Δ | B |
| 20 | ○ | A | ○ | A | Δ | B |
| 21 | ○ | A | ○ | A | ○ | A |
| 22 | ○ | A | ○ | A | ○ | A |
| 23 | ○ | A | ○ | A | ○ | A |
| 24 | ○ | A | ○ | A | ○ | A |
| 25 | ○ | A | ○ | A | ○ | A |
| 26 | ○ | A | ○ | A | ○ | A |
| 27 | ○ | A | ○ | A | ○ | A |
| 28 | ○ | A | ○ | A | ○ | A |
| 29 | ○ | A | ○ | A | ○ | A |
| 30 | ○ | A | ○ | A | ○ | A |

The conditions of the thermal shock test were determined so that one cycle contains placing at −40° C. for 30 min, placing at room temperature for 10 min, placing at 125° C. for 30 min and placing at room temperature for 10 min. The thermal shock test was repeated in 1000 cycles. It was observed that there was no trace of the creation of a molten portion in the circuit of each of the integral ceramic circuit boards, and that there was no trouble, such as a crack, or peeling of the circuit, in each of the boards after the thermal shock test.

The evaluation method and the evaluation criteria are as follows:

1. Evaluation on the molten state of the circuits

Method: by visual inspection

Criteria:

○: No circuit was molten.

Δ: Circuit was partially molten.

X: Circuit had molten portions created overall therein.

2. Evaluation on the thermal shock test

Method: Flaw detection analysis using an ultrasonic wave

Criteria:

A: No circuit was peeled.

B: Circuit was partially peeled.

C: Circuit was completely peeled.

EXAMPLE 4

By carrying out the same steps as Example 2, porous fired products made of silicon carbide were obtained, having a relative density (bulk density) of 65 vol %.

Next, a block was completed by performing the same steps as Example 2 except that a pure aluminum foil, which had a thickness of 0.4 mm and had an oxide film provided in a thickness of 1 µm on the entire surface of each of the fired products, was used. It is noted that the block included 30 integral ceramic substrates in layers. By performing the subsequent steps in the same way as Example 1, integral ceramic circuit boards were finished. The circuits had a surface formed with a plated layer of Ni and P in a thickness of 5 µm and a plated layer of Ni and B in a thickness of 2 µm.

With regard to the 30 integral ceramic circuit boards thus produced, the molten state of each of the circuits was inspected, and each of the circuits after the thermal shock test referred to Example 3 was observed. The results of the inspection and observation are shown in Table 1. It was revealed that there was no trace of the creation of a molten portion in the circuit of each of the integral ceramic circuit boards, and that there was no trouble, such as a crack, or peeling of the circuit, in each of the boards after the thermal shock test.

EXAMPLE 5 (COMPARATIVE EXAMPLES TO EXAMPLES 3 AND 4)

By performing the same steps as Example 3 except that pure aluminum foil without a barrier layer was used, integral ceramic circuit boards were produced. The circuits had a surface formed with a plated layer of Ni and P in a thickness of 5 µm and a plated layer of Ni and B in a thickness of 2 µm.

With regard to the 30 integral ceramic circuit boards thus produced, the molten state of each of the circuits was inspected, and each of the circuits after the thermal shock test referred to Example 3 was observed. The results of the inspection and observation are shown in Table 1. It was revealed that there was a trace of the creation of a molten portion in an integral ceramic circuit board, which was located in the vicinity of a central layer in the block. It was observed that the portion of the circuit of the ceramic board that corresponded to the molten portion was peeled after the thermal shock test.

INDUSTRIAL APPLICABILITY

The method for producing an integral ceramic circuit board according to the present invention can easily realize high yield production and is superior in mass production by using, as a circuit material, a metal foil with an adequate barrier layer preliminarily provided thereon, and utilizing a high pressure forging process, such as liquid forging or die casting, for producing a metal-ceramic composite, which is a composite of aluminum and silicon carbide. The present invention is quite industrially useful since it can easily produce a module having a good heat radiation property and high reliability.

The invention claimed is:

1. A method for producing an integral ceramic circuit board comprising:
    providing a ceramic substrate on a main surface of a porous molded product made of silicon carbide, the main surface being provided with or without a recess;
    providing at least one metal foil in contact with both of the ceramic substrate and the porous molded product so as to provide a layered structure;
    putting the layered structure in a pressure vessel;
    subjecting a metallic material containing aluminum as a main component to high pressure forging to impregnate the metallic material containing aluminum as a main component into voids in the porous molded product and to make a metal layer made of the at least one metal foil integral with the porous molded product and the ceramic substrate; and
    then forming a circuit from the metal layer.

2. The method according to claim 1, further preliminarily providing a barrier layer on an entire surface or a portion of a surface of the metal foil.

3. The method according to claim 2, wherein the barrier layer is made of an oxide.

4. The method according to claim 3, wherein the oxide, of which the barrier layer is made, is obtained by oxidizing an entire surface or a portion of a surface of the metal foil.

5. The method according to claim 2, wherein the metal foil is made of a metallic material containing aluminum of not less than 98.5 mass % purity as a main component.

6. The method according to claim 2, wherein the oxide, of which the barrier layer is made, is formed by subjecting an entire surface or a portion of a surface of the metal foil containing aluminum as a main component to anodic oxidation.

7. A method for producing an integral ceramic circuit board comprising:
    providing a ceramic substrate on a main surface of a porous molded product made of silicon carbide, the main surface being provided with or without a recess;
    providing a metal foil to cover both of the ceramic substrate and the porous molded product so as to provide a layered structure;
    putting the layered structure in a pressure vessel;
    subjecting a metallic material containing aluminum as a main component to high pressure forging to impregnate the metallic material containing aluminum as a main component into voids in the porous molded product and to make a metal layer made of the metal foil integral with the porous molded product and the ceramic substrate; and
    then forming a circuit from the metal layer,
    wherein a barrier layer is made of an oxide,
    further preliminarily providing the barrier layer on an entire surface or a portion of a surface of the metal foil,
    wherein the barrier layer has a thickness of not less than 0.1 µm and not greater than 10 µm.

8. A method for producing an integral ceramic circuit board comprising:
    providing a ceramic substrate on a main surface of a porous molded product made of silicon carbide, the main surface being provided with or without a recess;
    providing a metal foil to cover both of the ceramic substrate and the porous molded product so as to provide a layered structure;
    putting the layered structure in a pressure vessel;
    subjecting a metallic material containing aluminum as a main component to high pressure forging to impregnate the metallic material containing aluminum as a main component into voids in the porous molded product and to make a metal layer made of the metal foil integral with the porous molded product and the ceramic substrate; and
    then forming a circuit from the metal layer,
    further preliminarily providing a barrier layer on an entire surface or a portion of a surface of the metal foil, wherein the metal foil is made of a metallic material containing aluminum of not less than 98.5 mass % purity as a main component, further comprising dissolving the oxide formed in the metal layer with a solution containing at least one of hydrogen halide, ammonium halide and hydrogen peroxide in a step for etching a portion of the metal layer to form a circuit.

* * * * *